(12) United States Patent
Deng et al.

(10) Patent No.: US 11,070,176 B2
(45) Date of Patent: Jul. 20, 2021

(54) AMPLIFIER LINEARIZATION AND RELATED APPARATUS THEREOF

(71) Applicant: MEDIATEK Singapore Pte. Ltd., Solaris (SG)

(72) Inventors: Zhiming Deng, San Jose, CA (US); Osama Shanaa, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 54 days.

(21) Appl. No.: 16/273,261

(22) Filed: Feb. 12, 2019

(65) Prior Publication Data

US 2019/0253025 A1  Aug. 15, 2019

Related U.S. Application Data

(60) Provisional application No. 62/629,737, filed on Feb. 13, 2018.

(51) Int. Cl.
*H03F 1/32* (2006.01)
*H03F 1/02* (2006.01)
(Continued)

(52) U.S. Cl.
CPC ......... *H03F 1/3247* (2013.01); *H03F 1/0227* (2013.01); *H03F 1/223* (2013.01);
(Continued)

(58) Field of Classification Search
CPC .... H03F 1/3247; H03F 3/45188; H03F 1/223; H03F 1/3205; H03F 3/45475;
(Continued)

(56) References Cited

U.S. PATENT DOCUMENTS 7,224,222 B2 * 5/2007 Yum ..................... H03F 1/02
330/149
7,656,229 B2 * 2/2010 Deng .................. H03F 1/223
330/149
(Continued)

FOREIGN PATENT DOCUMENTS

TW  201128654 A  8/2011

OTHER PUBLICATIONS

Extended European Search Report for European Application No. 19156864.1 dated Jul. 3, 2019.
EP 19156864.1, Jul. 3, 2019, Extended European Search Report.

*Primary Examiner* — Hieu P Nguyen
(74) *Attorney, Agent, or Firm* — Wolf, Greenfield & Sacks, P.C.

(57) ABSTRACT

Some embodiments relate to a device, comprising an amplifier and a linearizer, the linearizer comprising a first transistor, the first transistor comprising a first terminal coupled to an input of the amplifier, a second terminal configured to be coupled to a DC supply voltage, and a control terminal configured to control a current flowing between the first and second terminals and configured to receive a DC bias voltage different from a voltage of the first terminal. Some embodiments relate to a device, comprising an amplifier, comprising an input, an output, and a first set of one or more transistors coupled between the input and the output, and a linearizer, comprising a second set of one or more transistors coupled between a DC supply voltage and the input of the amplifier, wherein the first set of transistors and the second set of transistors have a same topology.

20 Claims, 11 Drawing Sheets

(51) Int. Cl.
   *H03F 1/56* (2006.01)
   *H03F 3/213* (2006.01)
   *H03F 3/45* (2006.01)
   *H03F 1/22* (2006.01)

(52) U.S. Cl.
   CPC ......... *H03F 1/3205* (2013.01); *H03F 1/3211* (2013.01); *H03F 1/56* (2013.01); *H03F 3/213* (2013.01); *H03F 3/45188* (2013.01); *H03F 3/45475* (2013.01); *H03F 2200/211* (2013.01)

(58) Field of Classification Search
   CPC .......... H03F 1/3211; H03F 3/213; H03F 1/56; H03F 1/0227; H03F 2200/211
   USPC ................................ 330/149, 311, 252–261
   See application file for complete search history.

(56) References Cited

U.S. PATENT DOCUMENTS

| | | | |
|---|---|---|---|
| 7,936,220 B2* | 5/2011 | Li | ............................ H03F 1/223 |
| | | | 330/149 |
| 8,237,507 B1 | 8/2012 | Mirzaei et al. | |
| 8,514,020 B2* | 8/2013 | Collins, III | ........... H03F 1/3211 |
| | | | 330/151 |
| 2011/0018635 A1 | 1/2011 | Tasic et al. | |
| 2014/0266461 A1 | 9/2014 | Youssef et al. | |
| 2015/0188500 A1* | 7/2015 | Kang | .................. H03F 3/45179 |
| | | | 330/260 |

* cited by examiner

AMPLIFIER LINEARIZATION AND RELATED APPARATUS THEREOF

CROSS-REFERENCE TO RELATED APPLICATIONS

This application claims priority to U.S. provisional application Ser. No. 62/629,737, filed Feb. 13, 2018, titled "AMPLIFIER LINEARIZATION AND RELATED APPARATUS THEREOF," which is hereby incorporated by reference in its entirety.

BACKGROUND

Power amplifiers are known electronic devices for increasing the power of an Alternating Current (AC) signal. Typically, an amplifier will use electric power from a Direct Current (DC) power supply to multiply a voltage amplitude of an AC signal input to the amplifier by a gain factor, and to provide the multiplied signal as an output.

It is desirable for an amplifier to operate linearly across as wide a range of possible voltage amplitudes as possible. Over an input voltage range in which the amplifier operates linearly, an AC signal output by the amplifier will be proportional to an AC signal input by a gain factor which is constant over the input voltage range. Over an input voltage range in which the gain factor is not constant, the amplifier is operating non-linearly, and such non-linearity may be undesirable.

BRIEF SUMMARY

Some embodiments relate to a device comprising an amplifier and a linearizer. The linearizer may comprise a first transistor, comprising a first terminal coupled to an input of the amplifier, a second terminal configured to be coupled to a DC supply voltage, and a control terminal configured to control a current flowing between the first and second terminals and configured to receive a DC bias voltage different from a voltage of the first terminal.

The DC bias voltage may be selectable from among a plurality of DC bias voltages.

The amplifier may comprise a first transistor having a common-channel terminal configuration.

The amplifier may further comprise a second transistor having a common-control terminal configuration.

The first and second transistors may be field effect transistors (FETs) having common-source and common-gate configurations, respectively.

The linearizer may further comprise a second transistor through which the first transistor is coupled to the input of the amplifier, the second transistor comprising a first terminal coupled to the input of the amplifier, a second terminal coupled to the first terminal of the first transistor, and a control terminal configured to control a current flowing between the first and second terminals and configured to receive a DC bias voltage different from a voltage of the first terminal.

The second terminal may be coupled to an output of the amplifier.

A voltage at the control terminal may be either greater than a voltage at the first terminal by at least a threshold voltage of the first transistor and less than a voltage at the second terminal by at least the threshold voltage, or less than a voltage at the first terminal by at least the threshold voltage and greater than a voltage at the second terminal by at least the threshold voltage.

Some embodiments relate to a device, comprising an amplifier, the amplifier comprising an input, an output, and a first set of one or more transistors coupled between the input and the output, and a linearizer, comprising a second set of one or more transistors coupled between a DC supply voltage and the input of the amplifier, wherein the first set of transistors and the second set of transistors have a same topology.

The first set of transistors and the second set of transistors may each comprise a cascode topology or each comprise a non-cascode topology.

The first set of transistors and the second set of transistors may each comprise a cascode topology, and respective first and second transistors of the first set of transistors may comprise a common-control terminal and a common-channel terminal configuration.

Channels of first and second transistors of the second set of transistors may be coupled to one another between the input of the amplifier and the DC supply voltage.

In some embodiments, the first and second transistors of the first set of transistors may be field effect transistors (FETs) respectively comprising a common-gate and a common-source configuration.

The first set of transistors and the second set of transistors may each comprise a non-cascode topology, and a first transistor of the first set of transistors may comprise a common-channel terminal configuration.

Channel terminals of a first transistor of the second set of transistors may be coupled to the DC supply voltage and to the input of the power supply.

In some embodiments, the first transistor of the first set of transistors may be a field effect transistor (FET) comprising a common-source configuration.

The second set of transistors may be coupled between the input and the output of the amplifier.

The foregoing summary is provided by way of illustration and is not intended to be limiting.

DETAILED DESCRIPTION

Implementing an amplifier, such as a power amplifier to be used in a radio-frequency (RF) transmission system, may involve compromising between the efficiency and linearity of the amplifier. Amplifiers having better linearity typically offer poor operating efficiency, often dissipating more than half of all operating power into heat rather than into the AC signal output by the amplifier. For example, a class A power amplifier may operate linearly over a significantly wider range of input voltages compared to a class C power amplifier, but with an operating efficiency below 50%, and often even below 10%. Amplifiers having better operating efficiency typically offer poor linearity, having a relatively small range of voltages over which a gain factor of the amplifier is constant. For example, a class C power amplifier may operate with an efficiency as high or higher than 70%, but operates linearly over a significantly decreased range of input voltages compared to a class A amplifier. Thus, selection of an amplifier involves a tradeoff between efficiency and linearity.

The inventors have developed techniques for improving linearity in systems having a non-linear amplifier by compensating the amplifier with a linearizer. The linearizer may be a device coupled to an input of the amplifier and configured to provide a non-constant impedance transfer function for an AC signal received at the input of the amplifier. The non-constant impedance transfer function of the linearizer may compensate for a non-linear response of the amplifier over an input voltage range. For example, if the gain factor of the amplifier is increasing over a particular voltage range due to non-linearity of the amplifier, the impedance transfer function of the linearizer may compensate by decreasing over the voltage range such that an overall linearity of the linearizer together with the amplifier is improved over the voltage range. Thus, a linearizer and amplifier may be implemented in combination with improved overall linearity as compared to the amplifier alone.

Figure 1A:
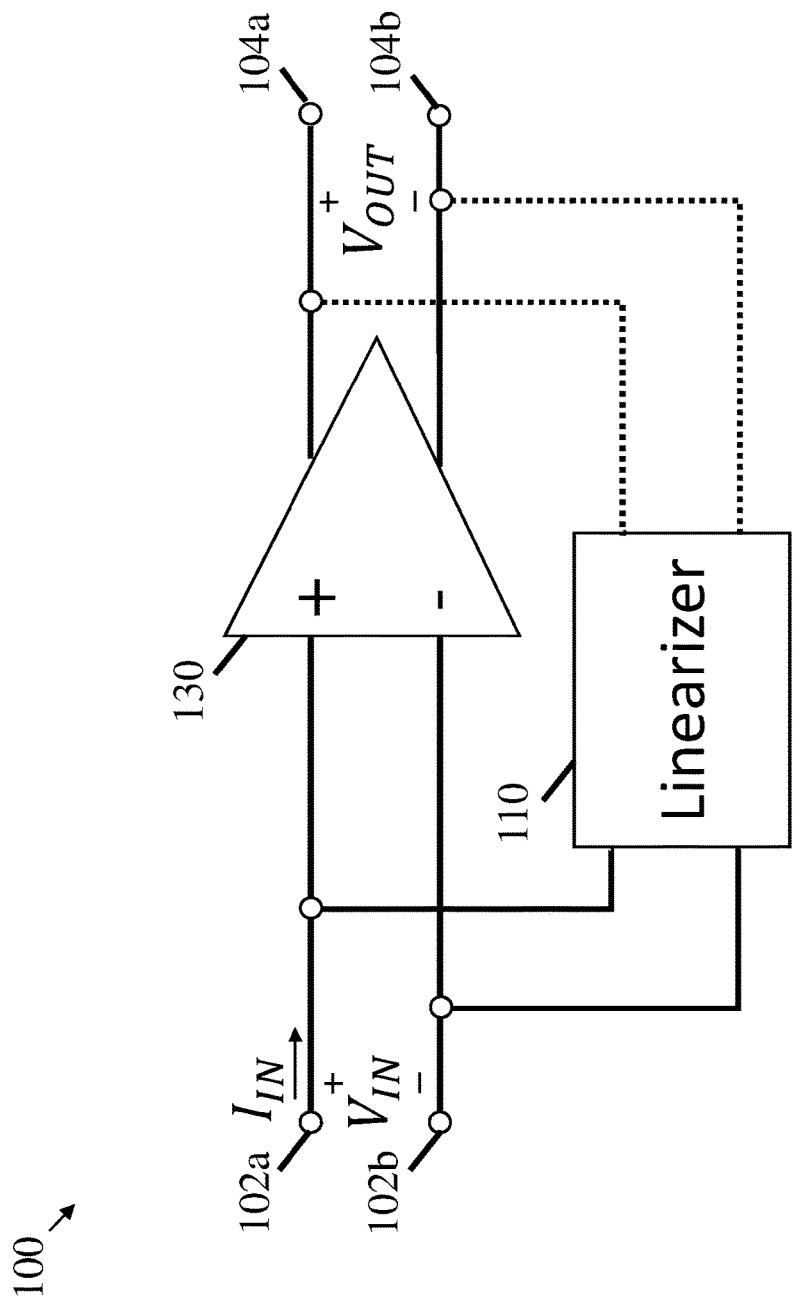
FIG. 1A is a block diagram illustrating an exemplary system including an amplifier compensated with a linearizer, in accordance with some embodiments.

FIG. 1A is a block diagram illustrating exemplary system 100 including amplifier 130 compensated with linearizer 110, in accordance with some embodiments. Linearizer 110 is coupled in parallel with amplifier 130. Inputs 102a and 102b of system 100 are coupled to each of linearizer 110 and amplifier 130, and outputs 104a and 104b of system 100 are coupled to amplifier 130. In some embodiments, outputs 104a and 104b may be coupled to linearizer 110, as shown in the dotted line in FIG. 1A.

Linearizer 110 and amplifier 130 are coupled between inputs 102a and 102b and outputs 104a and 104b. As a non-limiting example, inputs 102a and 102b may be coupled to a baseband-to-RF mixer, and outputs 104a and 104b may be coupled to an RF antenna. AC signals received at inputs 102a and 102b and produced at outputs 104a and 104b may be differential signals, with high side (+) signals received at input 102a and produced at output 104a, and with low side (−) signals received at input 102b and produced at output 104b. Alternatively, the AC signals may be single-ended signals. For example, input 102b and output 104b may not be included or may be connected to a fixed reference voltage.

Amplifier 130 may be configured to multiply a signal received at inputs 102a and 102b by a gain factor and to provide the result to outputs 104a and 104b. Amplifier 130 may include one or more transistors, and the gain factor of amplifier 130 may be set based on a configuration of the transistors such as their positioning and voltage bias condition.

Linearizer 110 may be configured to provide a non-linear shunt impedance for an AC signal received at inputs 102a and 102b of system 100. For example, linearizer 110 may be coupled between inputs 102a and 102b and a DC power supply. AC signals received at inputs 102a and 102b may be conducted to the DC power supply through linearizer 110 such that linearizer 110 provides a shunt impedance for system 100. Linearizer 110 may include one or more transistors, and the non-linear shunt impedance of linearizer 110 may be set based on a configuration of the transistors such as their positioning and voltage bias condition.

In system 100, linearizer 110 and amplifier 130 combine to provide an overall transfer function having improved linearity compared to the gain factor of amplifier 130. When combined, the overall transfer function of system 100 between inputs 102a and 102b and outputs 104a and 104b may be substantially more constant over a range of AC signal voltages than the gain factor of amplifier 130. For example, amplifier 130 may have a non-linear gain factor over a certain range of voltages of the signal received at inputs 102a and 102b. To compensate for the non-linear gain factor of amplifier 130, linearizer 110 may be configured to provide a non-linear impedance such that an overall transfer function between inputs 102a and 102b and outputs 104a and 104b has improved linearity over the certain range of voltages compared to the gain factor of amplifier 130. The gain factor of amplifier 130, the non-linear impedance of linearizer 110, and the overall transfer function of system 100 are described herein including with reference to FIG. 1B.

Although not shown in FIG. 1A, it should be appreciated that each of linearizer 110 and amplifier 130 are connected to a DC power supply. For example, linearizer 110 may couple AC signals received at inputs 102a and 102b to the DC power supply, and amplifier 130 may convert power received from the DC power supply into signal power for amplifying the AC signal at outputs 104a and 104b.

Figure 1B:
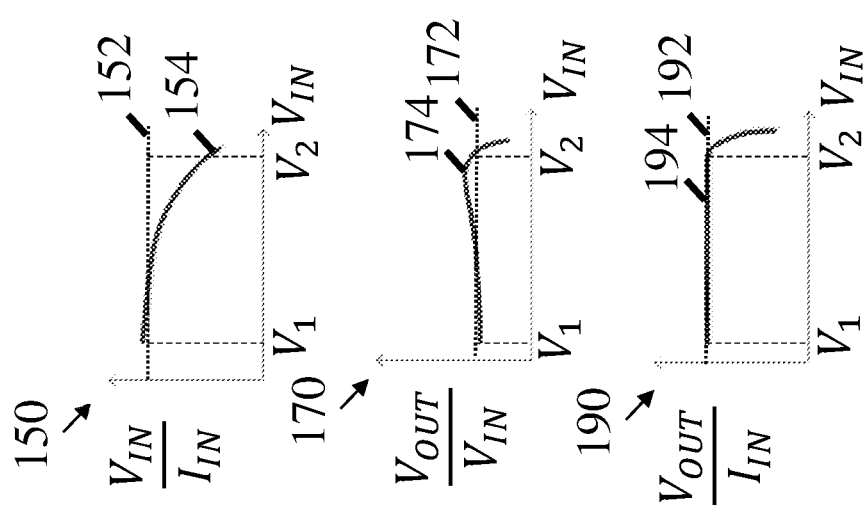
FIG. 1B includes a series of graphs of various transfer functions corresponding to the system illustrated in FIG. 1A.

FIG. 1B illustrates a series of graphs 150, 170 and 190, corresponding to various transfer functions of components in system 100, as illustrated in FIG. 1A. Graph 150 shows impedance transfer function 154 of linearizer 110, along with constant impedance transfer function 152. Graph 170 shows gain factor 174 of amplifier 130, along with constant gain factor 172. Graph 190 shows overall transfer function 194 of system 100 from inputs 102a and 102b to outputs 104a and 104b, along with constant transfer function 192. For example, overall transfer function 194 is the product of impedance transfer function 154 and gain factor 174. Impedance transfer function 154, gain factor 174, and overall transfer function 194 are plotted over a range of input voltages $V_{IN}$ from $V_1$ to $V_2$.

As shown in graph 150, impedance transfer function 154 of linearizer is 110 deviates from constant impedance transfer function 152 between $V_1$ and $V_2$. For example, linearizer 110 may include one or more transistors biased to produce a desired non-linear channel impedance between $V_1$ and $V_2$. Thus, impedance transfer function 154 is non-linear with respect to input voltages $V_{IN}$ from $V_1$ to $V_2$.

As shown in graph 170, gain factor 174 of amplifier 130 deviates from constant gain factor 172 between voltages $V_1$ and $V_2$. For example, amplifier 130 may be a class-C power amplifier having poor linearity between voltages $V_1$ and $V_2$. Thus, gain factor 174 is non-linear with respect to input voltages $V_{IN}$ from $V_1$ to $V_2$.

As shown in graph 190, overall transfer function 194 of system 100, including amplifier 130 with shunt-coupled linearizer 110, is substantially equal to constant transfer function 192 between voltages $V_1$ and $V_2$. The product of impedance transfer function 154 and gain factor 174 may result in an overall transfer function which shows improved linearity between voltages $V_1$ and $V_2$. For example, transistors of linearizer 110 may be biased to produce a non-linear channel impedance of the transistors which cancels out non-linearity in gain factor 174 of amplifier 130 between voltages $V_1$ and $V_2$. Since overall transfer function 194 is the product of impedance transfer function 154 and gain factor 174, overall transfer function 194 shows improved linearity between voltages $V_1$ and $V_2$ compared to gain factor 174.

Figure 2A:
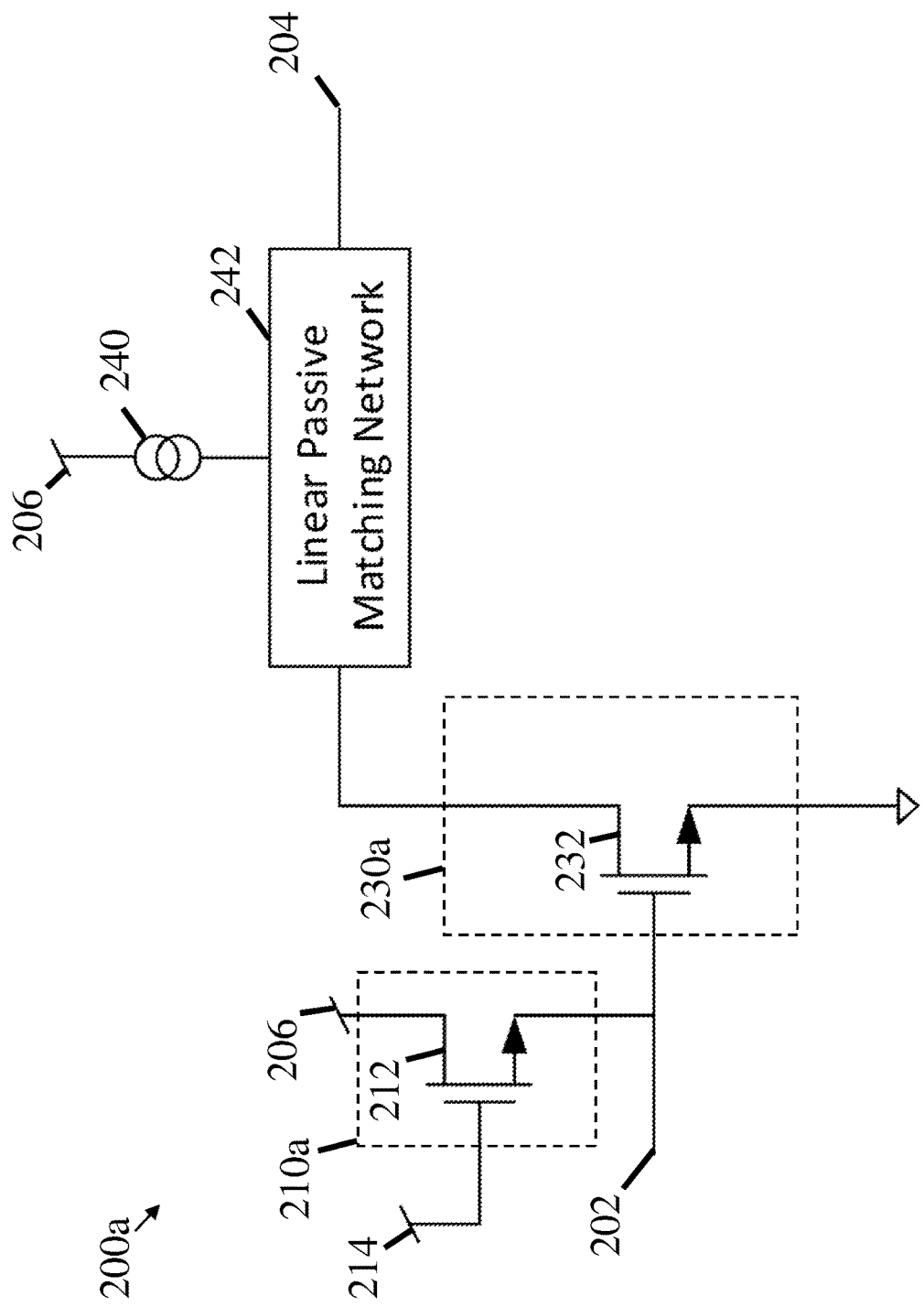
FIG. 2A is a circuit diagram illustrating an exemplary system including a single-ended amplifier compensated with a linearizer, in accordance with some embodiments.
Figure 2B:
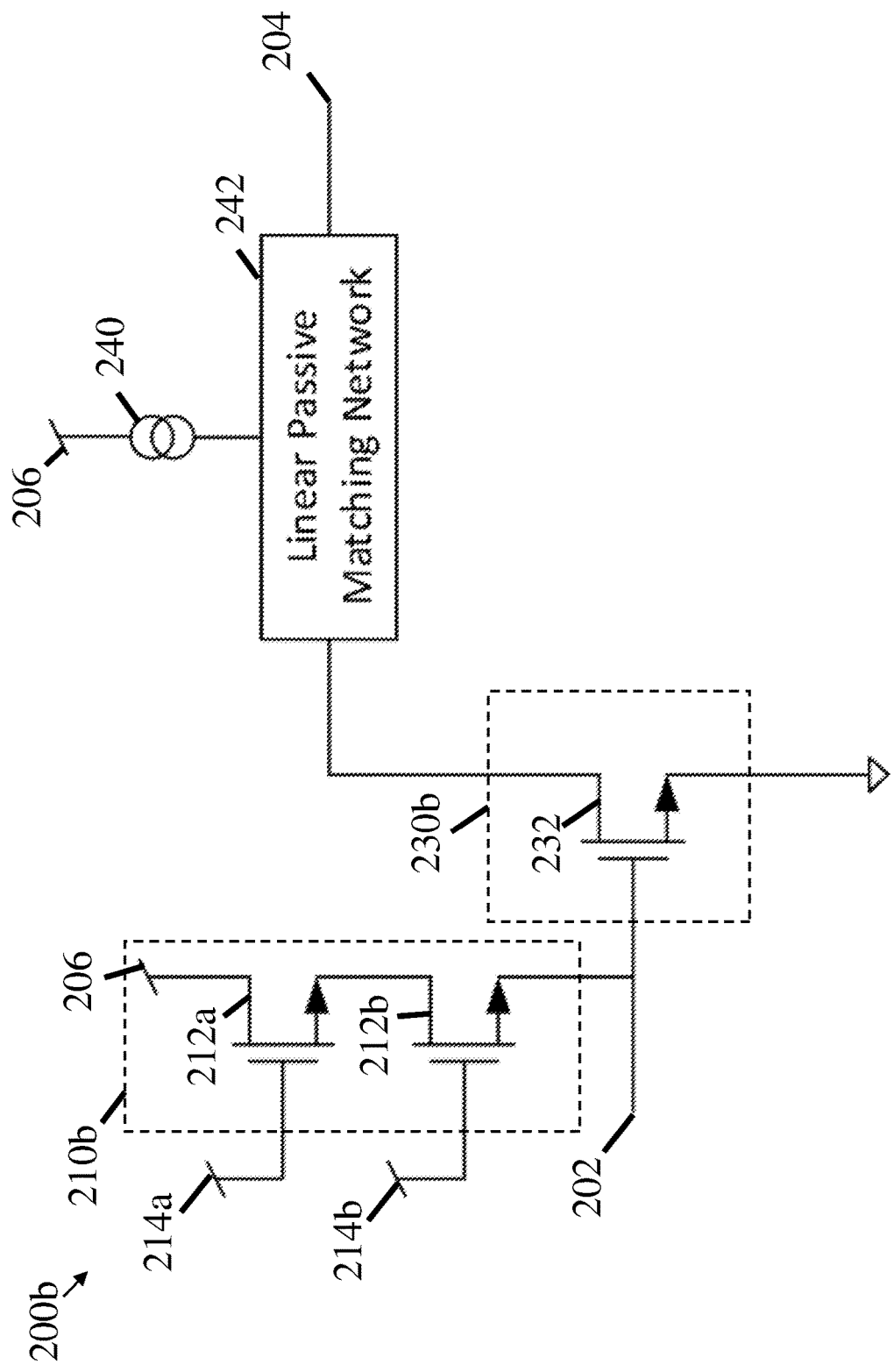
FIG. 2B is a circuit diagram illustrating an exemplary system including a single-ended amplifier compensated with a cascode linearizer, in accordance with some embodiments.
Figure 2C:
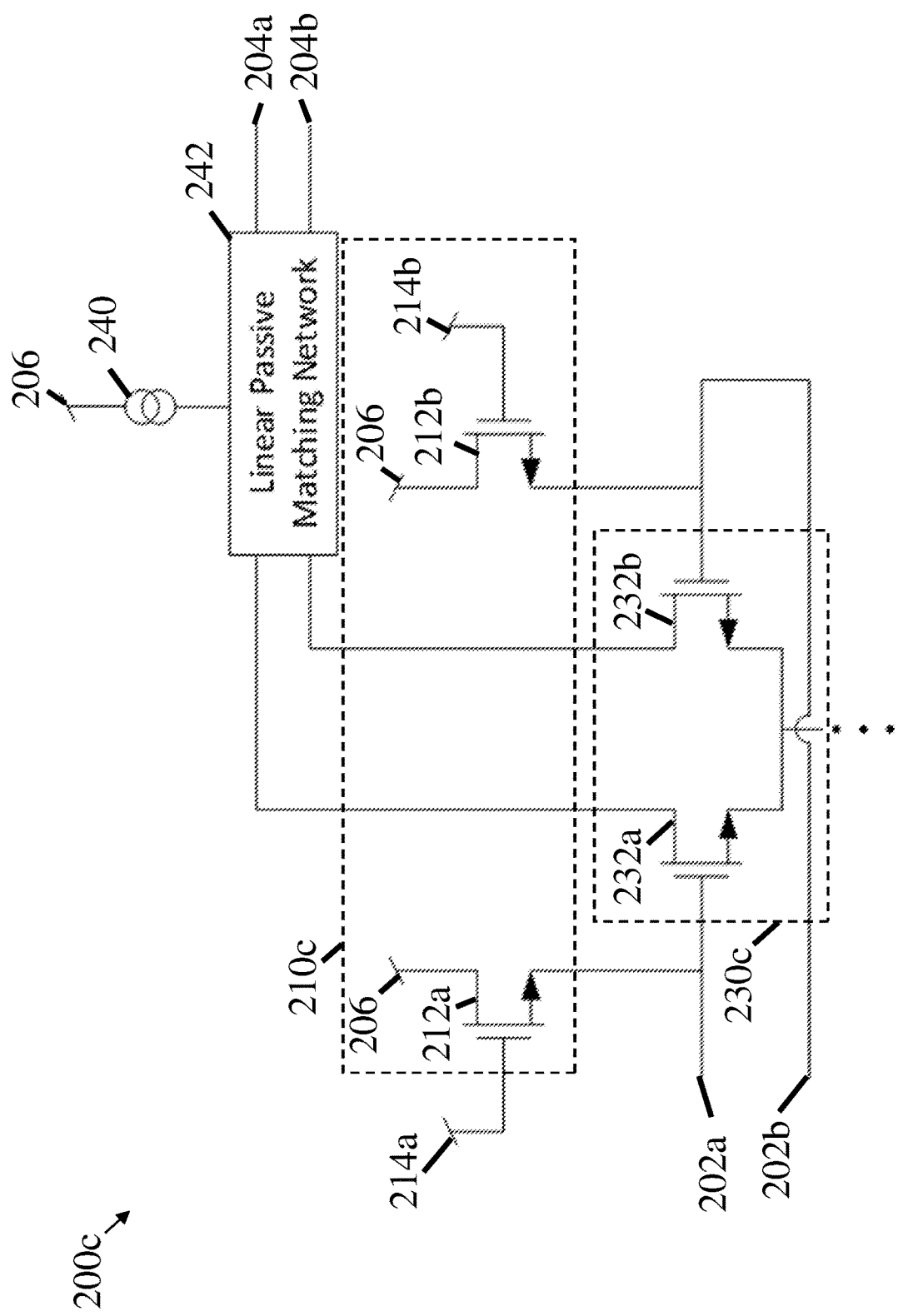
FIG. 2C is a circuit diagram illustrating an exemplary system including a differential amplifier compensated with a linearizer, in accordance with some embodiments.

The inventors have developed linearizers implemented with one or more transistors coupled to an amplifier. For example, the transistors may be coupled to an input of the amplifier with a channel of the transistors configured to provide a non-linear impedance for signals received at the input. FIGS. 2A-2C illustrate circuit diagrams of exemplary systems 200a, 200b, and 200c, each having a linearizer implemented with one or more transistors coupled to the amplifier. Each of systems 200a, 200b, and 200c, may be configured to operate in the manner described in connection with system 100 of FIGS. 1A-1B.

FIG. 2A is a circuit diagram illustrating system 200a including single-ended amplifier 230a compensated with linearizer 210a coupled between input 202 and output 204. System 200A is illustrated as a single-ended system. Accordingly, signals received at input 202 and provided at output 204 may be single-ended signals.

Amplifier 230a comprises transistor 232, which may be configured to amplify a signal received at a control terminal and to provide the amplifier result at a channel terminal coupled to output 204. In the illustrative embodiment of FIG. 2A, transistor 232 is a FET in a common-source configuration, with the control terminal of transistor 232 being a gate tied to input 202. Transistor 232 has a drain tied to output 204, and also to matching network 242. Matching network 242 may include a passive component such as inductor, and/or a balun. Matching network 242 is coupled to current mirror 240, which provides a current for biasing transistor 232. In some embodiments, the drain of transistor 232 may be tied to a source of a cascode transistor, a drain of which may be coupled to current mirror 240. The source of transistor 232 coupled to a common voltage terminal such as ground. However, the source of transistor 232 may be coupled to other components. For example, in some embodiments, the source of transistor 232 is coupled to current mirror 240.

In the illustrated common-source configuration, transistor 232 is configured to receive the AC signal at its gate, to amplify the AC signal based on a gain factor, and to provide the AC signal with added gain at its drain. For example, the gain factor may be set based on a DC bias voltage at the gate, the drain, and the source of transistor 232, as well as based on current provided by current source 240. The gain factor may be non-linear over a range of AC signal voltages at the gate. Transistor 232 may provide the AC signal with added gain at the drain, which is coupled to output 204.

It should be appreciated that some embodiments do not include current mirror 240. For example, in some embodiments, matching network 242 may be coupled to DC power supply 206. In some embodiments, transistor 232 may receive an input or provide an output to one or more transistors of an additional amplification stage of amplifier 230a. It should be appreciated that transistor 232 may have a different amplifier configuration, such as common-gate or common-drain, for example. Additionally, transistor 232 may be a different type of transistor such as a BJT, HEMT, IGBT, or HBT, and likewise may have a configuration such as common-base, common-emitter, or common-collector suitable to the corresponding type of transistor.

Linearizer 210a is configured to provide a non-linear impedance to compensate amplifier 230a. In FIG. 2A, linearizer 210a includes transistor 212 having a channel coupled between input 202 and DC power supply 206, and having a control terminal tied to DC bias voltage 214. Transistor 212 may be configured such that the AC signal received at input 202 is conducted through a non-linear channel impedance to DC power supply 206. DC power supply 206 may constitute an AC ground for the AC signal received at input 202. For example, the AC signal received at input 202 may include an AC component operating around a DC bias, and there is substantially no AC component at DC power supply 206. Accordingly, while the AC signal is not completely grounded at DC power supply 206, because the DC component of the signal is still present, the AC component of the AC signal may be negligible at DC power supply 206 as though it were grounded. In FIG. 2A, transistor 212 is a FET, with a source coupled to input 202 and a drain coupled to DC power supply 206. If the FET is biased into the saturation region, the channel impedance of the FET may be non-linear, such that the channel impedance varies depending on a voltage of the AC signal at input 202. It should be appreciated that transistor 212 may be a different type of transistor such as a BJT, HEMT, IGBT, or HBT.

The inventors have developed linearizers which may be implemented with a selectable impedance. For example, one or more transistors of the linearizer may receive a selectable control terminal bias voltage (e.g., a gate bias voltage for a FET or a base bias voltage for a BJT), which allows for selecting an impedance of the linearizer. For instance, the control terminal bias voltage may set a channel impedance of the transistors, which contribute to the impedance of the linearizer. In FIG. 2A, DC bias voltage 214 sets a non-linear channel impedance of transistor 212. Thus, a certain desired non-linear channel impedance for AC signals coupled between input 202 and DC power supply 206 through transistor 212 may be achieved by setting DC bias voltage 214 accordingly. For example, DC bias voltage 214 may set a particular non-linear channel impedance for received AC signals operating between a first AC voltage level and a second AC voltage level. In some embodiments, DC bias voltage 214 may be a selectable bias voltage for producing a desired non-linear channel impedance of transistor 212.

The inventors have recognized and appreciated that implementing a linearizer with a selectable impedance may reduce an overall size of the linearizer, thus lowering the manufacturing cost and improving the operating efficiency of the linearizer. In a linearizer without a selectable impedance, an impedance of the linearizer may be set by channel dimensions of devices within the linearizer. For example, the linearizer may include a diode-connected transistor, with an impedance of the linearizer set by a channel size, such as a channel width, of the transistor. To compensate for the non-linear response of the amplifier, the transistor of such a linearizer would need to have approximately a same size channel width as the transistor(s) of the amplifier, so as to match a current density of the amplifier. However, the channel widths of transistors in the amplifier may be large, and so implementing the linearizer to compensate for the amplifier results in an increased manufacturing cost when implemented in an integrated circuit. Additionally, the large transistor channel width results in large internal capacitances of the transistor, requiring more power to turn on the transistor. Accordingly, the linearizer may have a high cost and require more power to operate.

In contrast, a linearizer implemented with a selectable impedance, such as described herein including with reference to FIG. 2A, may be configured to provide a desired impedance with a smaller channel width than in linearizers without a selectable impedance. The impedance of the linearizer may be set not only based on a channel width of the transistors of the linearizer, but also according to the selectable control terminal bias voltage of the transistors. For example, the control terminal bias voltage may be set relative to a control terminal bias voltage of the transistor(s) of the amplifier, so as to accommodate non-linearity in the amplifier. The channel width of the transistor of the linearizer may be reduced when the control terminal bias voltage compensates for the impact of the reduced channel width on the impedance of the linearizer. Accordingly, the linearizer may be implemented with a small channel width while maintaining the capability of matching current density in the amplifier, resulting in a reduced manufacturing cost and improved operating efficiency, as compared to a linearizer without a selectable impedance. In some embodiments, the transistor(s) of the linearizer may have channel widths between 5% and 10% of the channel widths of the transistor (s) of the amplifier.

The inventors have developed linearizers which may be implemented including a common-control terminal configured transistor (e.g., common-gate for FETs or common-base for BJTs). For example, in FIG. 2A, transistor 212 is a FET in a common-gate configuration, with a source coupled to input 202 and a drain coupled to DC power supply 206A. A gate of transistor 212 is coupled to a DC bias voltage different from the DC supply voltage, and different from the voltage at input 202.

The inventors have developed linearizers which may be implemented with cascode common-control terminal configured transistors. For example, first and second FETs may be arranged in a common-gate configuration between an input of the amplifier and a DC supply voltage. FIG. 2B is a circuit diagram illustrating system 200b, including single-ended amplifier 230b compensated with cascode linearizer 210b coupled between input 202 and output 202. In FIG. 2B, linearizer 210b comprises transistors 212a and 212b which have a cascode topology. It should be appreciated that system 200b may be configured to operate in the manner described in connection with system 200a. For example, amplifier 230b may be configured to operate in the manner described for amplifier 230a.

Linearizer 210b may be configured to provide a non-linear impedance between input 202 and DC power supply 206 based on DC bias voltages 214a and 214b supplied at control terminals of transistors 212a and 212b. DC bias voltages 214a and 214b may be configured to set a non-linear channel impedance for each of transistors 212a and 212b. DC bias voltages 214a and 214b may be selectable bias voltages for producing a desired non-linear channel impedance for transistors 212a and 212b. Accordingly, an AC signal received at input 202 may be conducted through non-linear channel impedances of transistors 212a and 212b set by DC bias voltages 214a and 214b. It should be appreciated that DC bias voltages 214a and 214b may be a same DC bias voltage, or may be different DC bias voltages.

The inventors have developed linearizers which may be configured for differential systems. FIG. 2C is a circuit diagram illustrating system 200c, including differential amplifier 230c compensated with linearizer 210c coupled between inputs 202a and 202b and outputs 204a and 204b. In contrast to systems 200a and 200b, signals received at inputs 202a and 202b of system 200c may be differential signals, with a high side of the differential signal received at input 202a and a low side signal received at input 202b. In FIG. 2C, linearizer 210c may be configured to provide a non-linear impedance for differential signals received at inputs 202a and 202b.

Amplifier 230c may be configured to operate in the manner described for amplifiers 230a and 230b in connection with FIGS. 2A-2B. However, in contrast to FIGS. 2A-2B, amplifier 230c is configured to amplify differential signals received at inputs 202a and 202b. For example, amplifier 230c includes transistors 232a and 232b, with transistor 232a configured to amplify a high side component of a differential signal received at input 202a, and with transistor 232b configured to amplify a low side component of a differential signal received at input 202b. As shown in FIG. 2C, control terminals of transistors 232a and 232b are coupled to inputs 202a and 202b, and channels of transistors 232a and 232b are coupled to outputs 204a and 204b. Gain factors of transistors 232a and 232b may be set by a DC bias at control terminals and across channels of transistors 232a and 232b in the manner described for transistor 232 in connection with FIG. 2A. Transistors 232a and 232b are further configured to provide corresponding amplified components of the differential signal at outputs 204a and 204b respectively. DC biasing conditions of transistors 232a and 232b may be substantially equivalent, such that transistors 232a and 232b have substantially equivalent gain factors to avoid adding distortion to components of signals provided at outputs 204a and 204b.

Linearizer 210c includes transistor 212a coupled between input 202a and DC power supply 206, and transistor 212b coupled between input 202b and DC power supply 206. Transistors 212a and 212b have control terminals coupled to DC bias voltages 214a and 214b, such that non-linear channel impedances of transistors 212a and 212b may be set according to DC bias voltages 214a and 214b. For example, DC bias voltages 214a and 214b may be selectable bias voltages for producing a desired non-linear channel impedance for transistors 212a and 212b. Transistors 212a and 212b may be substantially equal in size and equivalent in configuration, for example having substantially equal DC bias voltages 214a and 214b, to avoid adding distortion into a differential signal received at inputs 202a and 202b. Distortion in signals provided at control terminals of transistors 232a and 232b of amplifier 230c would result in lower quality signals that may not be intelligible for systems configured to receive the signals provided at outputs 204a and 204b of system 200c.

Figure 3A:
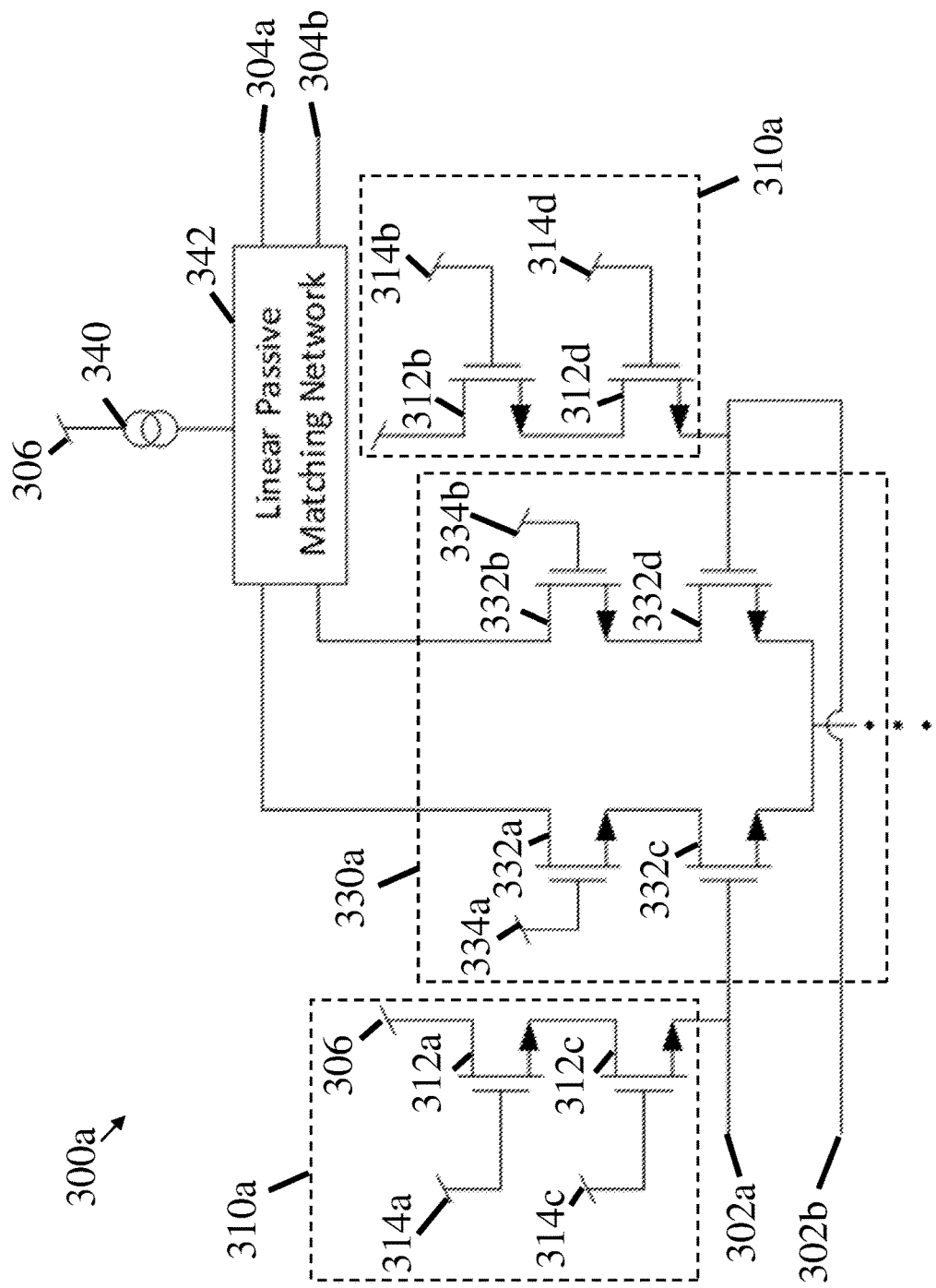
FIG. 3A is a circuit diagram illustrating an exemplary system including a cascode differential amplifier compensated with a cascode linearizer, in accordance with some embodiments.
Figure 3B:
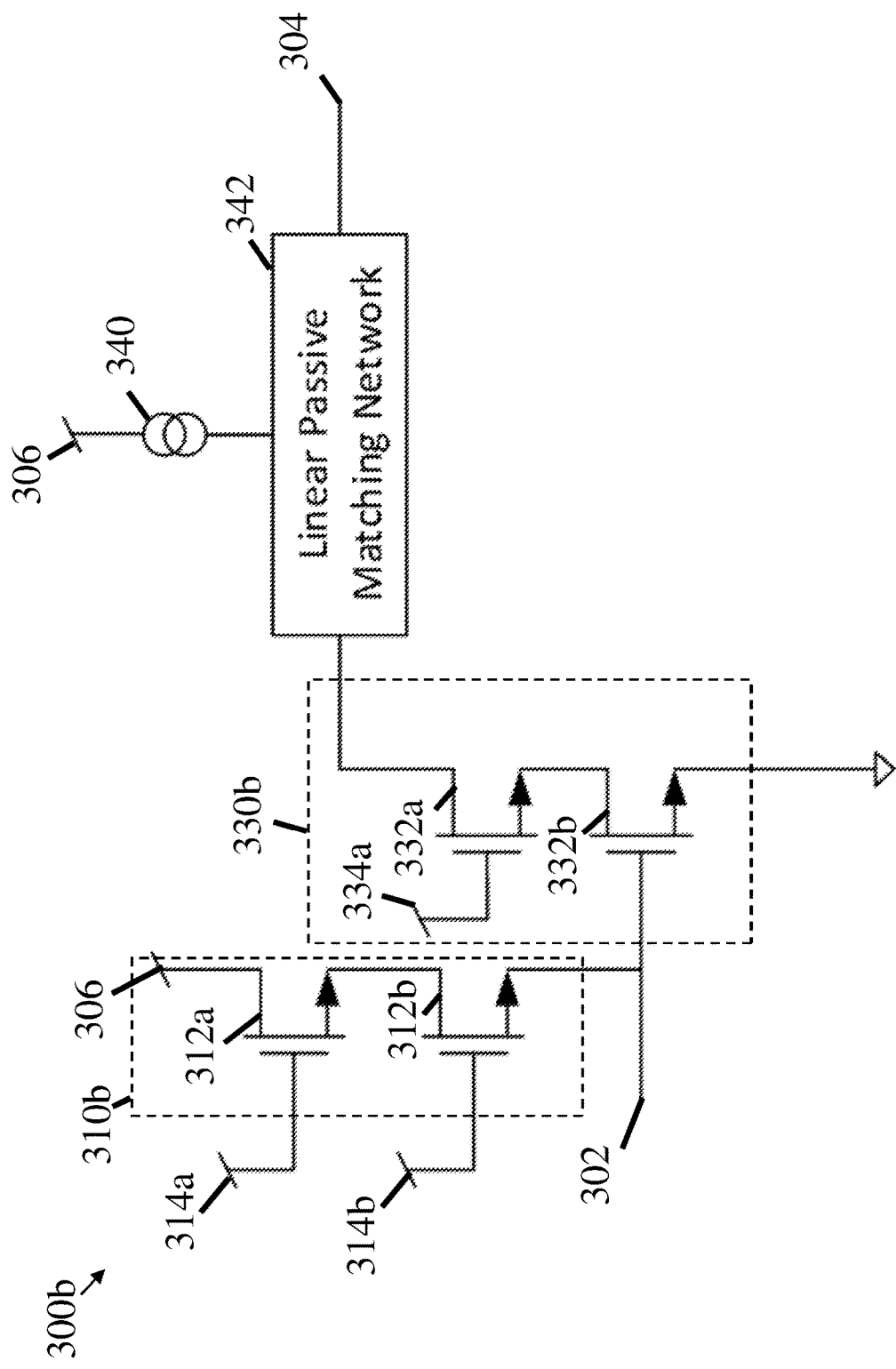
FIG. 3B is a circuit diagram illustrating an exemplary system including a cascode single-ended amplifier compensated with a cascode linearizer, in accordance with some embodiments.

The inventors have developed linearizers which may be implemented having a same topology as amplifiers for which they are configured to compensate. FIGS. 3A-3B illustrate exemplary systems including an amplifier and a linearizer in which the amplifier and linearizer have a same topology, in accordance with some embodiments.

FIG. 3A is a circuit diagram illustrating system 300a, including cascode differential amplifier 330a compensated with cascode linearizer 310a, coupled between inputs 302a and 302b and outputs 304a and 304b. Linearizer 310a and amplifier 330a each have a cascode configuration, and thus have a same topology. In the illustrated embodiment, linearizer 310a and amplifier 330a each have a cascode topology. It should be appreciated that system 300a may be configured to operate in the manner described in connection with FIG. 2C. For example, system 300a may be configured to receive differential signals at inputs 302a and 302b.

Amplifier 330a may have a cascode topology of transistors 332a, 332b, 332c and 332d. Transistors 332a and 332b may have a common-control terminal configuration. For instance, transistors 332a and 332b may be FETs, with gates of the FETs tied to DC bias voltages 334a and 334b. Transistors 332c and 332d may have a common-channel terminal configuration. For example, transistors 332c and 332d may be FETs, with gates of the FETs coupled to inputs 302a and 302b. Drains of the FETs may be coupled to transistors 332a and 332b such that amplifier 330a has a cascode topology.

Linearizer 310a may comprise transistors 312a, 312b, 312c and 312d configured in a cascode topology. Transistors 312a, 312b, 312c and 312d may be biased by DC bias voltages 314a, 314b, 314c and 314d. DC bias voltages 314a and 314b may be substantially equal, and DC bias voltages 314c and 314d may be substantially equal, so as to avoid adding distortion to a signal received at inputs 302a and 302b. In some embodiments, DC bias voltages 314a, 314b, 314c and 314d may all be substantially equal to one another.

FIG. 3B is a circuit diagram illustrating single-ended system 300b, including cascode single-ended amplifier 330b compensated with cascode linearizer 310b, coupled between input 302 and output 304. Linearizer 310b and amplifier 330b each have a cascode configuration, and thus have a same topology. System 300b may be configured to operate in the manner described in connection with FIG. 2B.

Figure 4A:
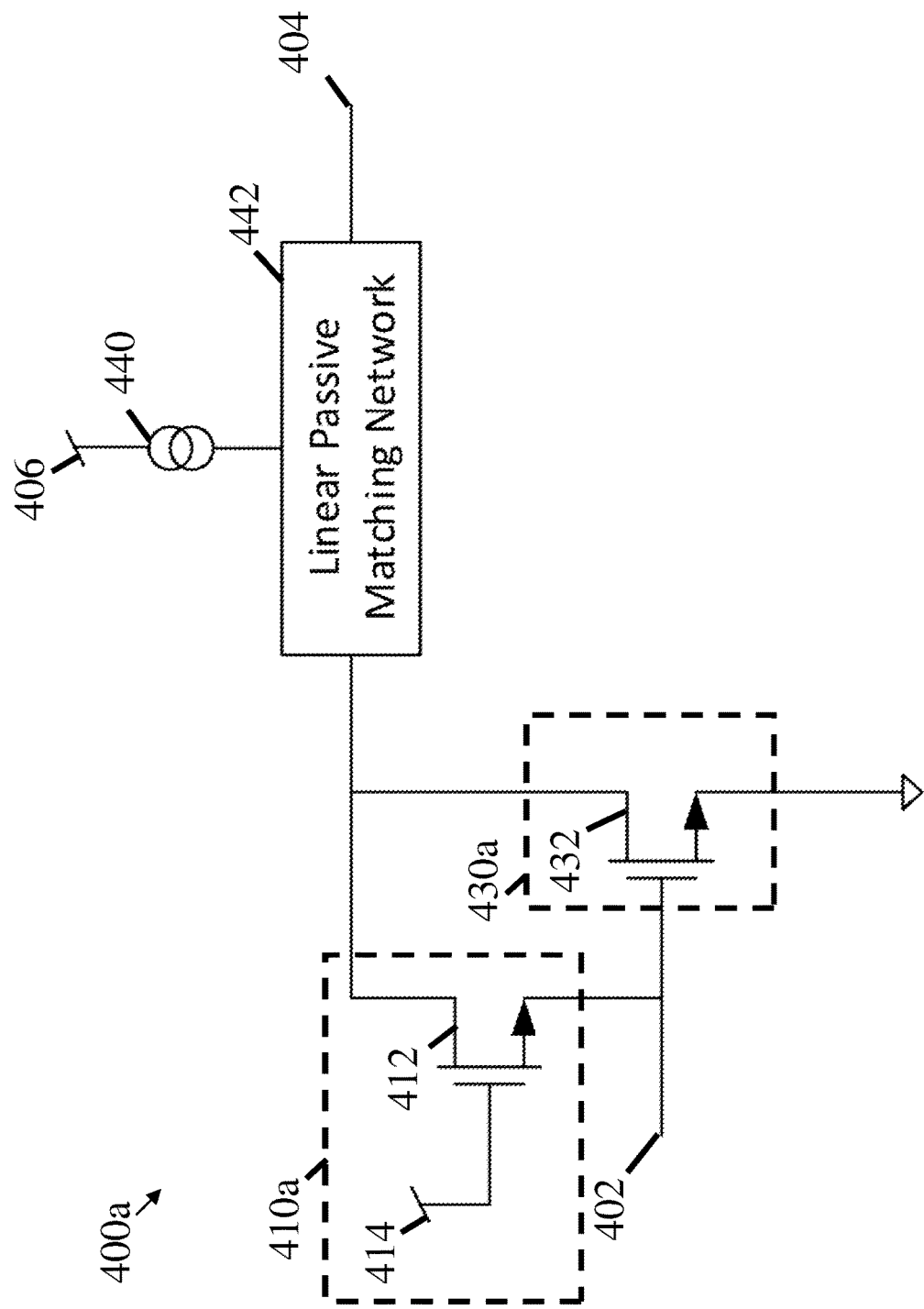
FIG. 4A is a circuit diagram illustrating an exemplary system including a single-ended amplifier compensated with an output-coupled linearizer, in accordance with some embodiments.
Figure 4B:
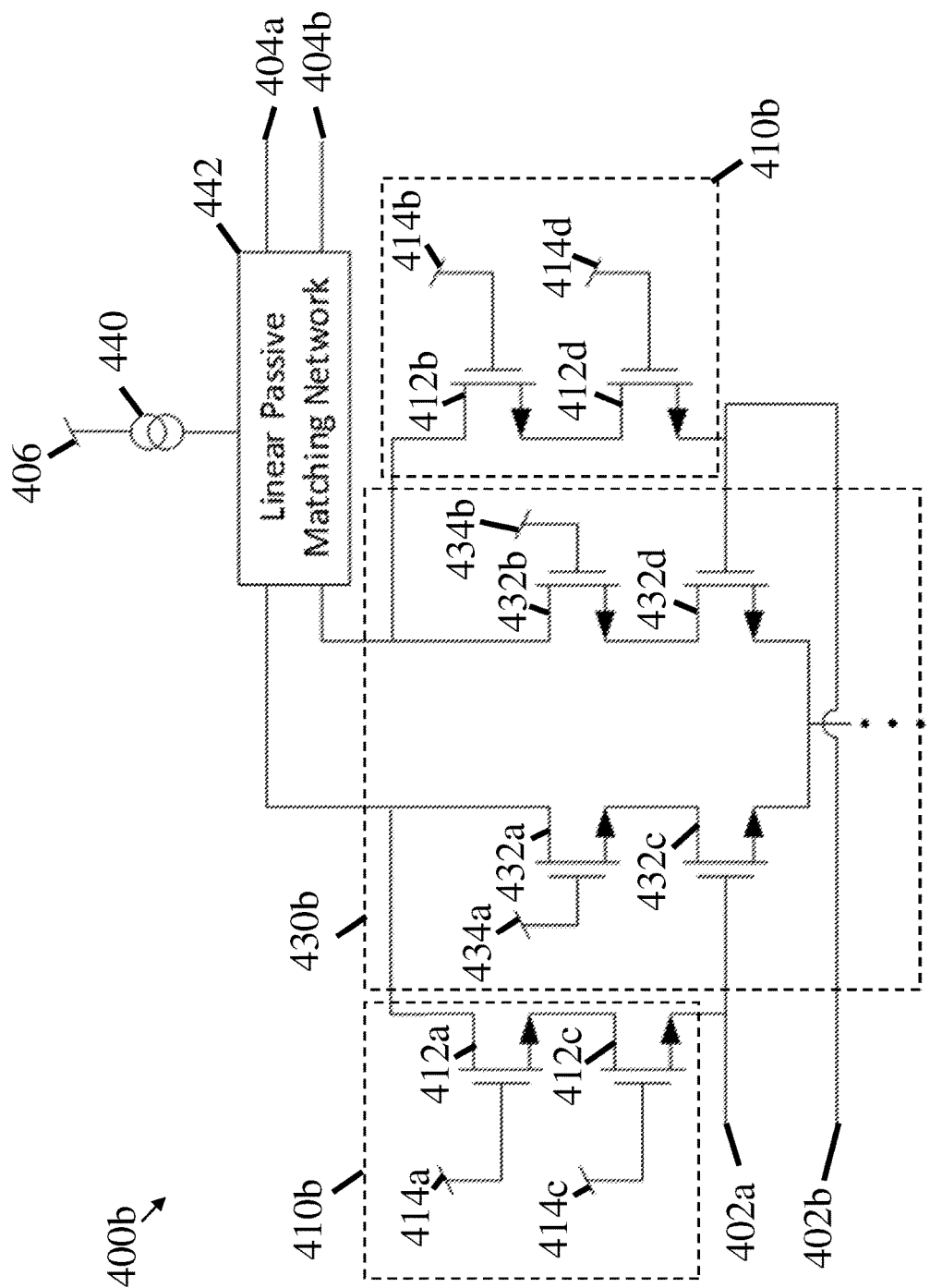
FIG. 4B is a circuit diagram illustrating an exemplary system including a cascode differential amplifier compensated with an output-coupled cascode linearizer, in accordance with some embodiments.

The inventors have developed linearizers configured for coupling to inputs and outputs of the amplifiers for which they are configured to compensate. FIGS. 4A-4B are circuit diagrams illustrating exemplary systems including an amplifier and an output-coupled linearizer, in accordance with some embodiments.

FIG. 4A is a circuit diagram illustrating system 400a, including single-ended amplifier 430a compensated with output-coupled linearizer 410a, coupled between input 402 and output 404. System 400a may be configured to operate in the manner described for system 200a in connection with FIG. 2A. For example, linearizer 410a may be configured to provide a non-linear impedance in parallel with amplifier 430a for signals received at input 402. Additionally, signals received at input 402 may be coupled to output 404 by way of linearizer 410a.

The inventors have recognized and appreciated that, because signals conducted through linearizer 410a may not experience a frequency shift, such signals may be superimposed at the output of amplifier 430a. Accordingly, system 400a may preserve substantially all of the signal received at input 402 and provide the amplifier signal at output 404. It should be appreciated that, in some embodiments, linearizer 410a may be configured to match a phase shift of amplifier 430a, such that signals received at input 402 reach output 404 through linearizer 410a in phase with signals which reach output 404 through amplifier 430a. In some embodiments, linearizer 410a may be configured to provide a 180 degree phase shift, such that signals received at input 402 may reach output 404 out of phase with signals which reach output 404 through amplifier 430a. In accordance with various embodiments, linearizer 410a may be configured to provide any desired phase shift for signals received at input 402. Additionally, it should be appreciated that, while linearizer 410a and amplifier 430a are illustrated as having a same non-cascode topology, linearizer 410a and amplifier 430a may have different topologies in accordance with various embodiments.

FIG. 4B is a circuit diagram illustrating exemplary system 400b including cascode differential amplifier 430b compensated with output-coupled cascode linearizer 410b, in accordance with some embodiments. System 400b may be configured to operate in the manner described in connection with FIG. 4A. For example, linearizer 410b is coupled between inputs 402a and 402b and outputs 404a and 404b, and may be configured to provide a non-linear impedance in parallel with amplifier 430b. However, in contrast to FIG. 4A, system 400b is configured to receive differential signals at inputs 402a and 402b, and linearizer 410b and amplifier 430b have cascode topologies. It should be appreciated that linearizer 410b and amplifier 430b may be configured to operate in the manner described for linearizer 310a and amplifier 330a in connection with FIG. 3A.

Figure 5A:
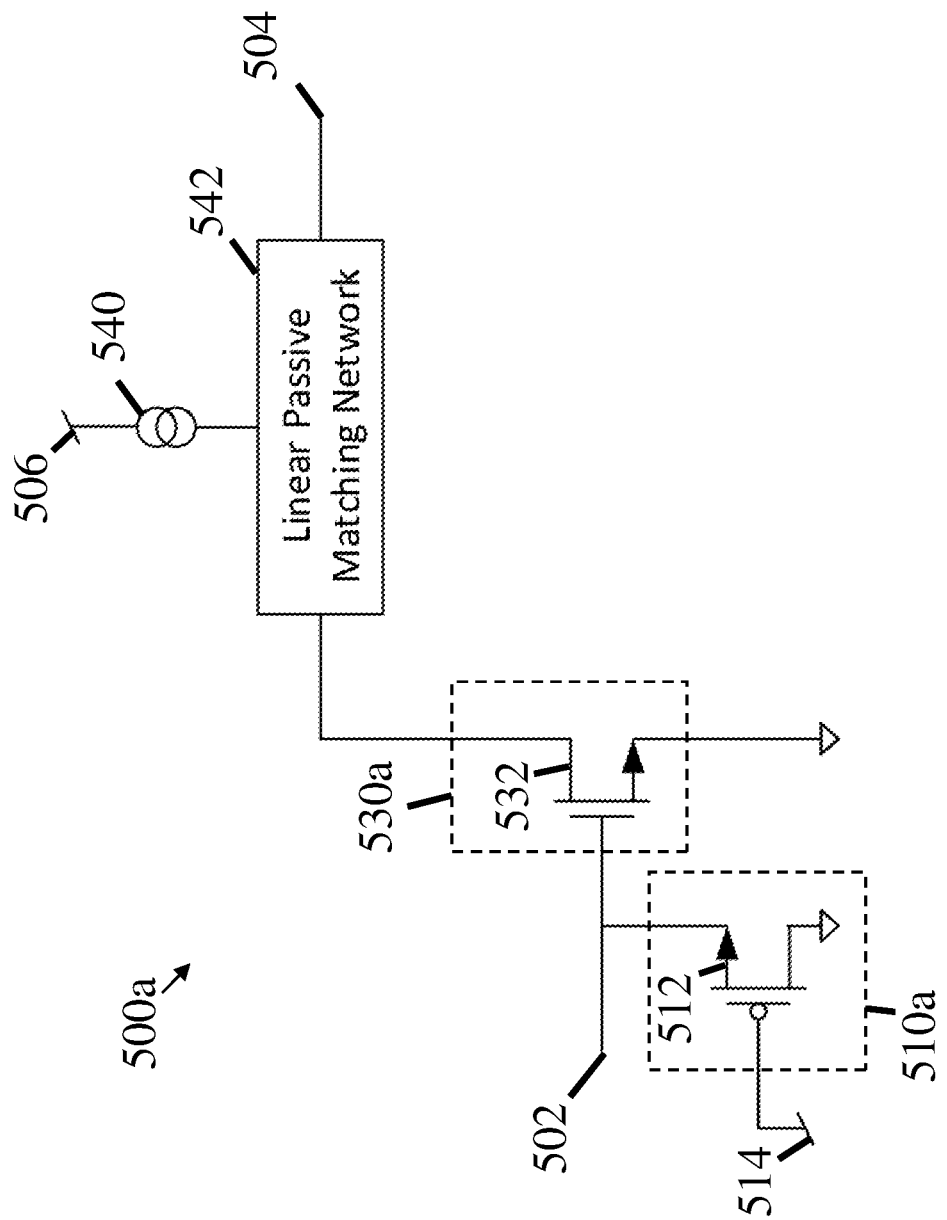
FIG. 5A is a circuit diagram illustrating an exemplary system including a single-ended amplifier compensated with a PMOS linearizer, in accordance with some embodiments.

FIG. 5A is a circuit diagram illustrating exemplary system 500a including single-ended amplifier 530a compensated with PMOS linearizer 510a, in accordance with some embodiments. System 500a may be configured to operate in the manner described in connection with FIG. 2A. For example, linearizer 510a may be configured to provide a non-linear impedance in parallel with amplifier 530a. However, in contrast to linearizer 210a of FIG. 2A, linearizer 510a includes PMOS transistor 512, having a control terminal biased by DC bias voltage 514. In some embodiments, DC bias voltage 514 may be a negative supply voltage from DC power supply 506. It should be appreciated that linearizer 510a may be configured to operate in the manner described for linearizer 210a in connection with FIG. 2A.

Figure 5B:
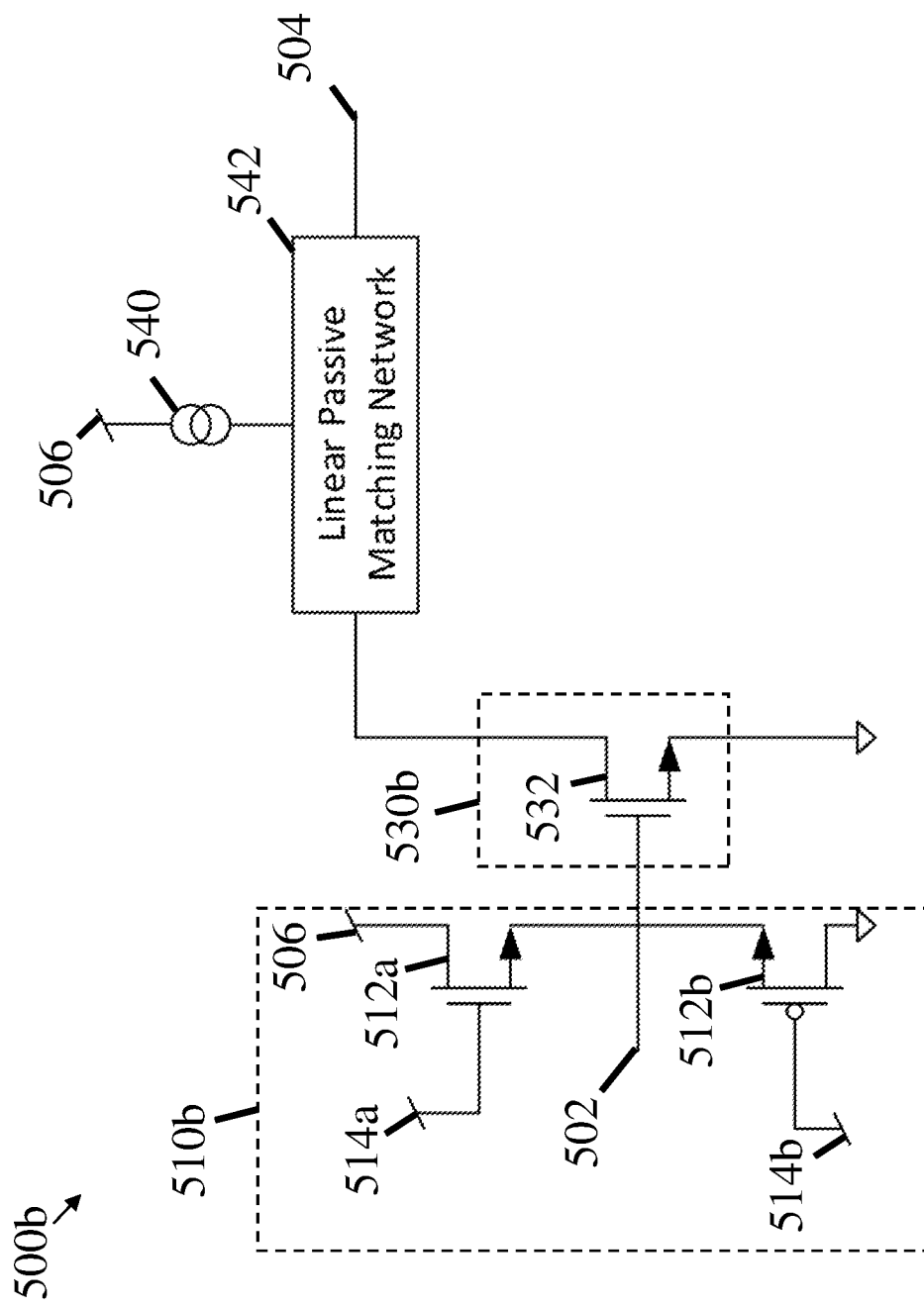
FIG. 5B is a circuit diagram illustrating an exemplary system including a single-ended amplifier compensated with a PMOS and NMOS linearizer, in accordance with some embodiments.

FIG. 5B is a circuit diagram illustrating exemplary system 500b including single-ended amplifier 530b compensated with PMOS and NMOS linearizer 510b, in accordance with some embodiments. System 500b may be configured to operate in the manner described in connection with FIG. 2A. For example, linearizer 510b may be configured to provide a non-linear impedance in parallel with amplifier 530b. However, in contrast to linearizer 210a of FIG. 2A, linearizer 510b includes NMOS transistor 512a and PMOS transistor 512b. NMOS transistor 512a is biased by DC bias voltage 514a, which may be configured in the manner described for DC bias voltage 214 in connection with FIG. 2A. PMOS transistor 512b is biased by DC bias voltage 514b, which may be configured in the manner described for DC bias voltage 514 in connection with FIG. 5A.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

It should be appreciated that the above described transistors may be implemented in any of a variety of ways. For example, one or more of the transistors may be implemented as bipolar junction transistors or field-effect transistors (FETs), such as metal-oxide semiconductor field-effect transistors (MOSFETs), junction field-effect transistors (JFETs), heterostructure field-effect transistors (HFETs), heterojunction bipolar transistors (HBTs), and high electron mobility transistors (HEMTs). In instances where one or more transistors described herein are implemented as BJTs, the gate, source, and drain terminals described above for such transistors may be base, emitter, and collector terminals, respectively.

Additionally, it should be appreciated that amplifiers described herein may comprise multiple cascade stages of common-source, common-control terminal and/or cascode configured transistors. In some embodiments, amplifier 130 may comprise a class C power amplifier. In some embodiments, amplifiers described herein may comprise a power amplifier belonging to any one of classes A, B, AB, C, D, E, F, G and H. In some embodiments, amplifier 130 may comprise a low-noise amplifier.

Additionally, it should be appreciated that illustrated embodiments which omit current mirror 240 may be adapted to include current mirror 240.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A device, comprising:
   an amplifier; and
   a linearizer comprising a first transistor, the first transistor comprising:
   a first terminal coupled to an input of the amplifier;
   a second terminal configured to receive a DC supply voltage transferred to the second terminal from a DC power supply; and
   a control terminal configured to control a current flowing between the first and second terminals and configured to receive a DC bias voltage different from a voltage of the first terminal, wherein the DC bias voltage is selectable from among a plurality of DC bias voltages.

2. The device of claim 1, wherein the amplifier comprises a first transistor having a common-channel terminal configuration.

3. The device of claim 2, wherein the amplifier further comprises a second transistor having a common-control terminal configuration.

4. The device of claim 3, wherein the first and second transistors are field effect transistors (FETs) having common-source and common-gate configurations, respectively.

5. The device of claim 1, wherein the linearizer further comprises a second transistor through which the first transistor is coupled to the input of the amplifier, the second transistor comprising:
   a first terminal coupled to the input of the amplifier;
   a second terminal coupled to the first terminal of the first transistor; and
   a control terminal configured to control a current flowing between the first and second terminals and configured to receive a DC bias voltage different from a voltage of the first terminal.

6. The device of claim 1, wherein the second terminal is coupled to an output of the amplifier.

7. The device, of claim 1, wherein a voltage at the control terminal is either:
   greater than a voltage at the first terminal by at least a threshold voltage of the first transistor and less than a voltage at the second terminal by at least the threshold voltage; or
   less than a voltage at the first terminal by at least the threshold voltage and greater than a voltage at the second terminal by at least the threshold voltage.

8. The device of claim 1, wherein, in response to receiving the DC bias voltage at the control terminal, the first transistor is configured to control an impedance between the first and second terminals.

9. The device of claim 1, wherein the second terminal of the first transistor is configured to be AC-coupled and DC-coupled to the DC power supply.

10. A device, comprising:
    an amplifier, comprising:
    an input;
    an output; and
    a first set of one or more transistors coupled between the input and the output; and
    a linearizer, comprising:
    a second set of one or more transistors coupled between a DC supply voltage and the input of the amplifier;
    wherein the first set of transistors and the second set of transistors have a same topology; and
    wherein the second set of one or more transistors is configured to receive the DC supply voltage transferred to the second set of one or more transistors from a DC power supply.

11. The device of claim 10, wherein the first set of transistors and the second set of transistors each comprise a cascode topology or each comprise a non-cascode topology.

12. The device of claim 11, wherein the first set of transistors and the second set of transistors each comprise a cascode topology, and wherein respective first and second transistors of the first set of transistors comprise a common-control terminal and a common-channel terminal configuration.

13. The device of claim 12, wherein channels of first and second transistors of the second set of transistors are coupled to one another between the input of the amplifier and the DC supply voltage.

14. The device of claim 13, wherein the first and second transistors of the first set of transistors are field effect transistors (FETs) respectively comprising a common-gate and a common-source configuration.

15. The device of claim 11, wherein the first set of transistors and the second set of transistors each comprise a non-cascode topology, and wherein a first transistor of the first set of transistors comprises a common-channel terminal configuration.

16. The device of claim 15, wherein channel terminals of a first transistor of the second set of transistors are coupled to the DC supply voltage and to the input of the power supply.

17. The device of claim 16, wherein the first transistor of the first set of transistors is a field effect transistor (FET) comprising a common-source configuration.

18. The device of claim 10, wherein the second set of transistors are coupled between the input and the output of the amplifier.

19. The device of claim 10, wherein the second set of one or more transistors is configured to be AC-coupled and DC-coupled to the DC power supply.

20. The device of claim 10, wherein the second set of one or more transistors is configured to receive the DC supply voltage at steady-state.

* * * * *